United States Patent [19]

Thoma et al.

[11] Patent Number: 5,672,991
[45] Date of Patent: Sep. 30, 1997

[54] DIFFERENTIAL DELAY LINE CIRCUIT FOR OUTPUTTING SIGNAL WITH EQUAL PULSE WIDTHS

[75] Inventors: Nandor Gyorgy Thoma, Plano; Trong Duc Nguyen, Austin, both of Tex.

[73] Assignee: International Business Machines Corporation, Armonk, N.Y.

[21] Appl. No.: 632,184

[22] Filed: Apr. 15, 1996

Related U.S. Application Data

[63] Continuation of Ser. No. 422,364, Apr. 14, 1995, abandoned.

[51] Int. Cl.$^6$ .................................................. H03H 11/16
[52] U.S. Cl. ........................ 327/239; 327/258; 327/256; 327/272
[58] Field of Search .............................. 327/258, 269, 327/271, 272, 284, 285, 288, 274, 287, 161, 153, 215, 239, 404, 154, 256, 201, 213, 231, 175, 306, 309, 318, 319, 321, 322, 176, 254–259, 263, 244, 296, 225; 377/76, 79

[56] References Cited

U.S. PATENT DOCUMENTS

| | | | |
|---|---|---|---|
| 3,575,609 | 4/1971 | Izumi | 327/213 |
| 3,740,660 | 6/1973 | Davies, Jr. | 331/45 |
| 3,789,239 | 1/1974 | Heeren | 327/213 |
| 4,109,209 | 8/1978 | Bismarck | 327/269 |
| 4,472,645 | 9/1984 | White | 327/212 |
| 4,506,167 | 3/1985 | Little et al. | 327/215 |
| 5,059,818 | 10/1991 | Witt et al. | 327/175 |
| 5,140,179 | 8/1992 | Takano | 327/215 |
| 5,144,173 | 9/1992 | Hui | 327/277 |
| 5,258,660 | 11/1993 | Nelson et al. | 327/141 |
| 5,294,847 | 3/1994 | Grossman et al. | 327/215 |
| 5,306,971 | 4/1994 | McCune | 327/270 |
| 5,365,128 | 11/1994 | Bazes | 327/141 |
| 5,495,189 | 2/1996 | Choi | 326/97 |

FOREIGN PATENT DOCUMENTS

| | | | |
|---|---|---|---|
| 56-122526 | 9/1981 | Japan | 327/201 |
| 3-187513 | 8/1991 | Japan | 327/201 |

*Primary Examiner*—Timothy P. Callahan
*Assistant Examiner*—My-Trang Nu Ton
*Attorney, Agent, or Firm*—Mark E. McBurney

[57] ABSTRACT

A signal delay device is provided which enhances noise immunity by using a differential circuit, but also maintains the phase of the input clock signals. This device will also correct the phase of clock signals which are input to the delay device in an out of phase condition. The present invention is a delay circuit that includes functionally connecting each of the output signals with each of the input signals. Thus, the output signals are dependent on the same input and the steady state condition is the point where the leading edge of a first output signal intersects the trailing edge of a second output signal at the point which corresponds to one half of the pulse height of both signals. Since the signals are complements of one another, they will cross at 50% of their pulse height when they are "in phase". Thus, the present invention will maintain "in phase" input signals and seek an "in phase" condition for signals that are input to the delay circuit which are "out of phase".

17 Claims, 6 Drawing Sheets

DIFFERENTIAL DELAY LINE CIRCUIT FOR OUTPUTTING SIGNAL WITH EQUAL PULSE WIDTHS

This is a continuation of application Ser. No. 08/422,364 filed Apr. 14, 1995, now abandoned.

TECHNICAL FIELD

This invention relates to delay line circuitry used in modern data processing systems to distribute clock signals to various logical units on an integrated circuit. More specifically, a device is provided which not only creates the delay required to control the timing relationships between the units, but also maintains the proper phase between differential clock signals.

BACKGROUND OF THE INVENTION

Delay line circuits are known in the art and have been used in integrated circuits (IC) for many years. Clock generator circuits provide a clock signal to various components on the IC (or other ICs in the data processing system), such as a latch, register, buffer, driver, receiver, or the like. It is often the case, due to the physical wiring constraints, that the lines between the clock and the components are not equal in length. This causes the clock signal to reach the components at different times. Of course, the clock will reach the closest component to the clock generator first. This causes problems in that many components in the integrated circuit need to be synchronized to the same clock signal.

Figure 2:
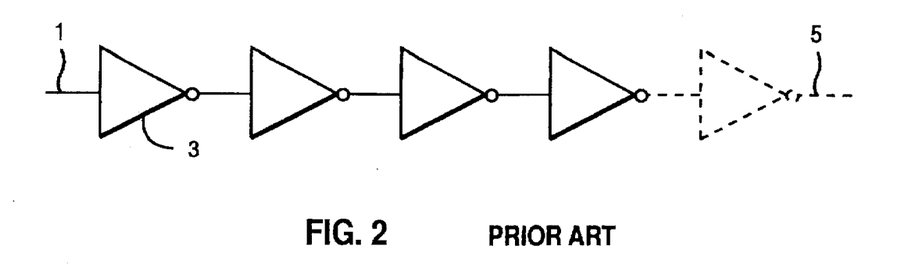
FIG. 2 is a schematic diagram of a prior art device including serially connected, single signal inverters which create a time delays but is also highly susceptible to electrical noise.

One prior art solution has been to connect a series of inverters, as shown in FIG. 2 such that the signal input to the inverters on line 1 is delayed by going through the circuits in inverters 3. In this manner, the input signal on line 1 is delayed a predetermined period of time in order for the output signal on line 5 to correspond with other signal running from the clock generator to the farthest component. Thus, the clock signals will arrive at both of the components at the same time. However, this prior art method has a serious problem with noise immunity. If the series connected inverters of FIG. 2 are in somewhat close proximity to, for example, a power distribution line (Vdd), then electrical noise can be induced in the inverter circuits 3. This noise can cause the clock signal waveform to be altered such that the leading edge of the pulse is not well defined, or the like. In order to solve this noise immunity problem, differential inverters were used as delay circuits. Differential circuits are also well known in the art and have the advantage of being relatively immune to the influence of electrical noise. Briefly, a differential circuit receives two signals and outputs at least one signal based on the difference between the two input signals.

Figure 4:
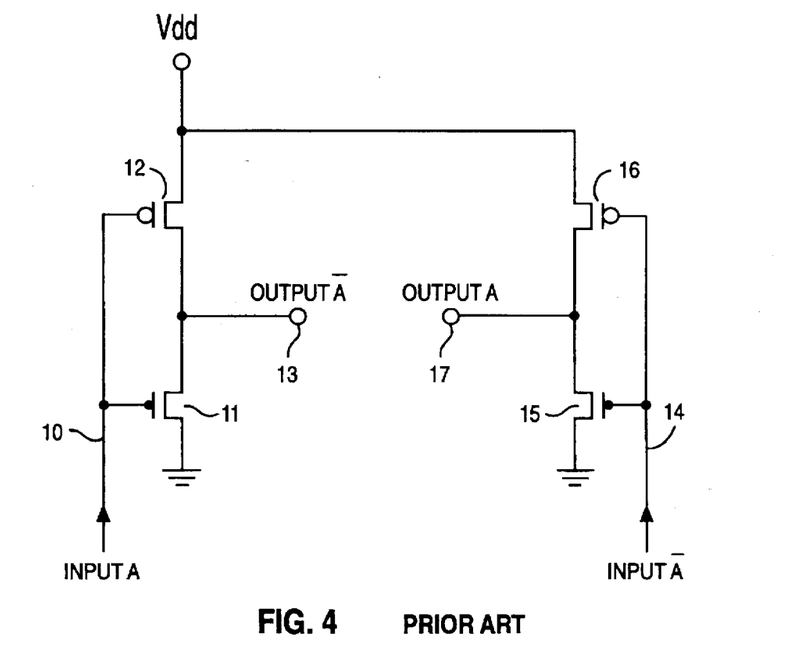
FIG. 4 is a circuit diagram of a prior art differential circuit which could be used to create a time delay.

FIG. 4 shows a differential circuit that has been used as the inverter stage in a delay circuit found in the prior art. The clock signals are input to the circuit on lines 10 and 14. Clock signal "A" (true) is input on line 10 and the complement of "A" is input on line 14. The gates of two "N" type transistors 11 and 15 are connected to input lines 10 and 14, respectively. Additionally, the gates of two "P" type devices 12 and 16 are also connected respectively to input lines 10 and 14. Those skilled in the art will understand that an "N" type transistor is "turned on", i.e. will conduct current when a voltage (logical "1") is applied to its gate, but presents a very high impedance when there is no voltage at its gate (logical "0"). A "P" type device will conduct current when there is the absence of a voltage (logical "0") at its gate, but present a high impedance when there is a voltage (logical

2

"1") at the gate. The system voltage Vdd is input to "P" transistors 12 and 16 to provide the electrical energy to the circuit. "N" type transistor 11 is connected to "P" transistor 12 and to ground potential. Similarly, "N" transistor 15 is connected in a similar manner to "P" device 16 and to ground. Nodes 12 and 17 output the signal from the differential circuit of FIG. 4. When an "A", input on line 10 is a logical 1, is a then the complement of "A" at line 14 is a logical 0. The voltage on line 10 will cause device 11 to be turned on, thereby pulling the output at node 13 to ground (logical 0), or the complement of "A". The absence of voltage on line 14 will turn on the "P" device 16, thereby pulling node 17 to Vdd (logical 1), or true "A". It can be seen that the circuit of FIG. 4 will provide a differential output signal which is based on the clock signals input on lines 10 and 14. The circuit of FIG. 4 has been shown to minimize the noise, since the noise present on line 10 is cancelled by the noise on line 14.

However, in solving the problem of electrical noise the differential circuit of FIG. 4 has introduced another serious problem, i.e. skew. That is, the clock signal input to line 10 becomes out of phase with the clock signal on line 14. It can be seen that the output at node 13 is dependent only on the input at line 10 and is independent of the input to line 14. Similarly, the output at node 17 is dependent on the input to line 14 and independent of the input to line 10. The process technology by which these circuit are fabricated creates physical differences in the integrated circuit. For example, the line width of lines 10 and 14 may be enough different to cause one signal to lag the other (e.g. "A" complement can lag true "A"). Other physical characteristics present in the circuit can cause an out of phase condition, such as the proximity of a power line being closer to one line than the other. With the speeds of today's computer systems exceeding 100 MHz, and the voltage Vdd becoming smaller, it is exceedingly likely that an out of phase condition will occur. Thus, complicated phase adjustment circuitry is needed to ensure that the output signals at nodes 13 and 17 remain in phase.

Therefore, it can be seen that a need exists for a system that can not only provide noise immunity, but also maintain the phase of the clock signals, and correct any out of phase condition, without the need for extensive phase adjustment circuitry.

SUMMARY OF THE INVENTION

In contrast to the prior art, the present invention provides a signal delay device which not only provides noise immunity by using a differential circuit, but also maintains the phase of the input clock signals. Further, the present invention will also correct the phase of clock signals which are input to the delay device in an out of phase condition.

Broadly, the present invention is a delay circuit that includes functionally connecting each of the output signals with each of the input signals. In this manner, the output signals are dependent on the same input and the steady state condition is the point where the leading edge of a first output signal intersects the trailing edge of a second output signal at the point which corresponds to one half of the pulse height of both signals. Since the signals are complements of one another, they will cross at 50% of their pulse height when they are "in phase". Thus, the present invention will maintain "in phase" input signals and seek an "in phase" condition for signals that are input to the delay circuit which are "out of phase".

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENT

Figure 1:
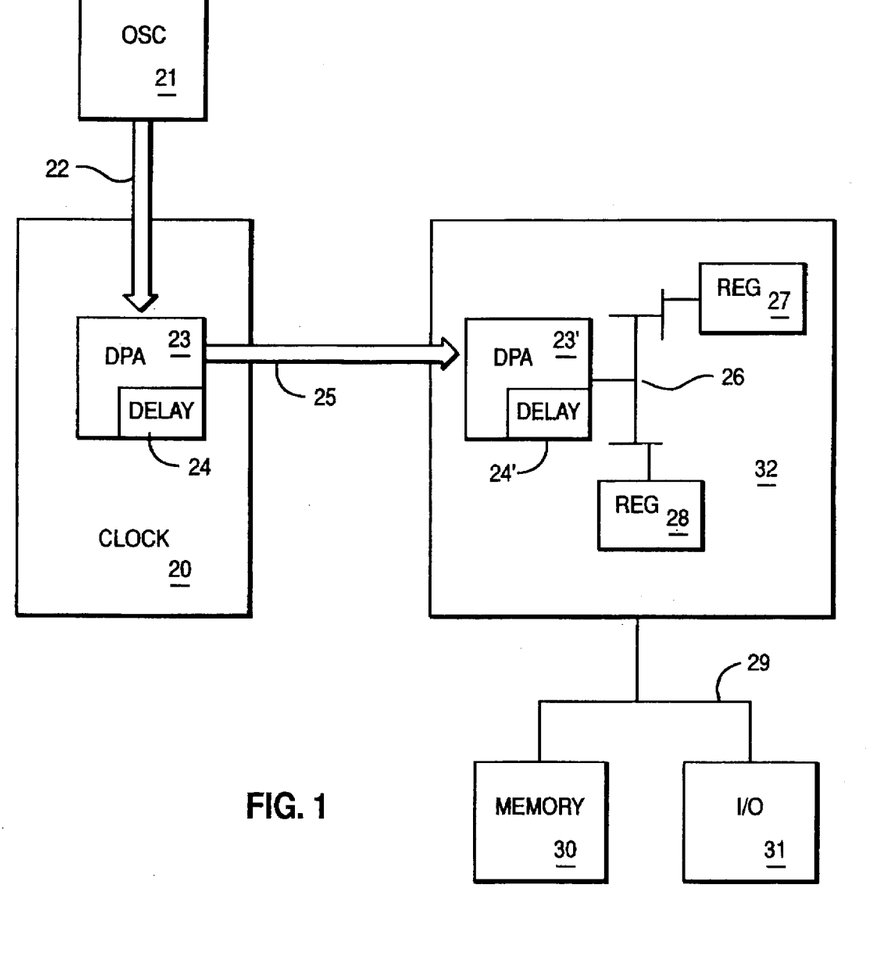
FIG. 1 is a block diagram showing how a delay circuit, such as provided by the present invention is utilized in a data processing system.

Referring to FIG. 1, a block diagram of a system that utilizes the present invention is shown. It will be understood by those skilled in the art that the present invention can be embodied in a single integrated circuit (chip) or used to maintain the proper clock signal phase across multiple chips in a computer system A clock generator 20 is shown for providing the system clock signal to various devices which are synchronous with other devices in the system. An oscillator 21 provides the actual two phase clock signal (shown in FIG. 6), which is substantially a square wave with a leading and trailing edge having a certain slope. The slope is due to the physical characteristics of the system. The clock signals (A and A complement) are provided to clock 20 by a signal line 22 having two distinct paths. One path is for the output clock signal and the other is a feedback path from a digital phase adjuster included (DPA) 23 which monitors the actual phase between the A and A complement clock signals and provides the feed back signals back to the oscillator 21 and other DPAs 23, such that the phase can be adjusted, if necessary.

Figure 5:
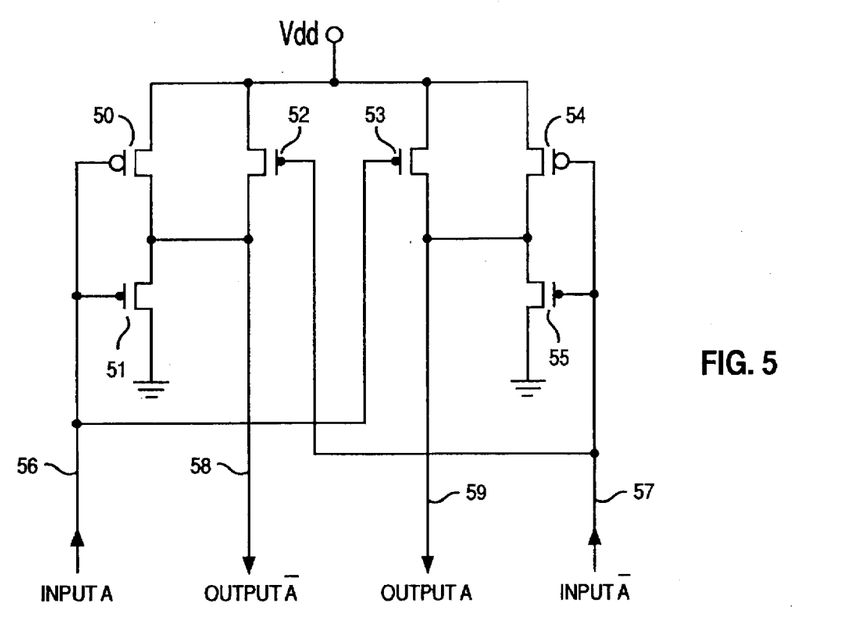
FIG. 5 is a circuit diagram of a first embodiment of the present invention showing how each input signal is functionally connected to each output signal, thus causing an "in phase" condition as the steady state output.

DPA 23 includes the delay device of the present invention. In a preferred embodiment, the delay is a differential circuit wherein the output signals are each is dependent on both of the input signals (FIG. 5). DPA 23 in the clock unit is connected to DPA 23' in functional unit 32, which may be on a separate chip (e.g. a memory or I/O controller), or another unit, such as a bus interface unit on the same chip. DPA 23' includes a delay unit 24' which is then shown in FIG. 1 as being connected to a clock distribution network (S-tree) 26. This S-tree 26 provides the clock signals to various devices on unit 32. For example registers 27 and 28 are connected to S-tree 26. It should be noted that the physical distance of the wiring between register 27 and DPA 23' is not necessarily the same as the distance between register 28 and DPA 23'. Thus, delay unit 24' is used to slow one of the signals (the signal to the nearest register) to ensure that both signals reach their destination simultaneously. In one example, unit 32 may be in a microprocessor, such as one of the PowerPC microprocessors, available from IBM Corp. (PowerPC is a trademark of IBM Corporation). In this case the microprocessor will transmit data and instructions between a memory unit 30 and input output (I/O) unit 31 via a system bus 29.

Figure 9:
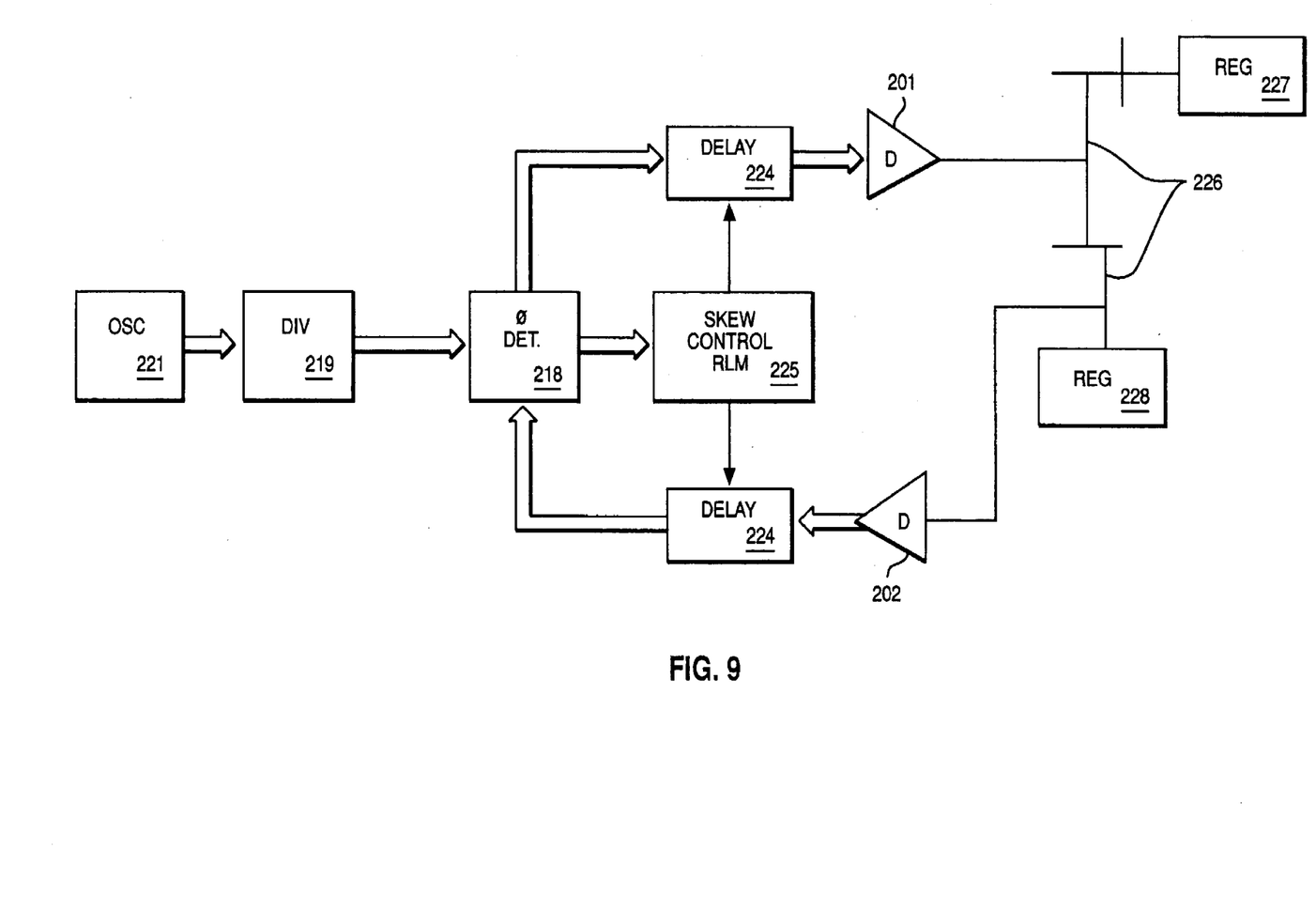
FIG. 9 is a block diagram illustrating the digital phase adjuster (DPA), including the delay circuit of the present invention, shown in FIG. 1.

FIG. 9 is a block diagram showing a the digital phase adjuster of the present invention is greater detail. An oscillator 221 output two complementary signals to a divider 219, which may divide the frequency of the signal from the oscillator. For example, many microprocessors are currently operating at frequencies of 100 MHz, while a I/O devices and memory units may operate at a fraction of that speed e.g. 50 MHz. In this case, divider 219 will be used to cut the microprocessor frequency in half by dividing by two (2). The complementary signals are then provided to a phase detector 218 which determines their phase relationship and then supplies the control signals to a skew control random logic macro (RLM) 225. The skew control 225 receives the information from phase detector 218 and then determines the amount of delay that will cause the signals to become in phase. Delay devices 224 are basically a set of delay stages that are electrically connected in series. Skew control 225 is basically a switch that controls the output of the phase delay to other circuits (e.g. multiplexer) which can then receive the output signal from any combination of the stages in the delay circuit. Skew control 225 is a control circuit that receives the output from the phase detector. Based on the information output from the phase detector, skew control 225 will determine the number of delay stages through which the clock signal must pass in order for the clock signals to be in phase. Thus, the amount of delay can be regulated by skew control 225 depending on the input from phase detector 218. That is, if one of the signals is leading the other by a large amount of time, skew control 225 may switch the signal through a large number of delay stage circuits (FIGS. 5 and 10) in order to adjust ("slow" it down) in order to bring the signals into phase. Also, skew control 225 can cause a signal lagging signal to pass through a lesser number of delay stage circuits, thereby minimizing the delay and bring the signal into phase with the other signal.

Delay 224 provides the clock signals to a driver 201 (e.g. off chip driver, OCD) to amplify the signal before it is transmitted to S-tree 226. The signal then causes data, or instructions to be placed in registers 227 and 228, as discussed previously in conjunction with FIG. 1. A feedback path is also provided from S-tree 226, through a feedback driver 202 and another delay 224. The feedback signal is then provided to phase detector 218 and to adjust the clock signals input to S-tree 226 by using skew control 225, as discussed above.

The present invention will now be described with reference to FIG. 5. It should be noted that the circuit of FIG. 5 is one stage that can be used in the delay device of FIG. 3. That is, stage 40 may includes the circuit of FIG. 5, where lines 56 and 57 are the input signals A and A complement and lines 58 and 59 are the output signals which are then provided to the next stage, e.g. 41.

Referring to FIG. 5, input 56 (A) provides a clock signal to the gates of N transistor 51 and P device 50. Transistor 51 is also connected to transistor 50 and to ground (reference voltage). The circuit voltage (VDD) is connected to the other side of transistor 50. Inputs 57 (A complement) provides the differential clock signal to N-type transistor 55 and P device 54. These transistors are connected similarly to devices 50 and 51. That is, transistor 55 is connected to ground and to P device 54, which is also connected to Vdd. Two additional N-type transistors 52 and 53 are connected in parallel with P-type devices 50 and 54. Specifically, the drain of device 52 is connected to Vdd and the source is connected to the drain of device 50 and the drain of device 51, which also transmits an output signal (A complement) on line 58. Further, the drain of transistor 53 is connected to Vdd and its source is connected to both the drain of transistor 54 and the drain of transistor 55, and then outputs a signal (A) on line 59.

From FIG. 5 it can also be seen that the input signal on line 56 is connected directly to the gate of N transistor 53. Also, the signal input on line 57 is provided directly to the gate of N transistor 52. It can be seen that N device 52 controls the output on line 58 and N device 53 controls the output of the circuit on line 59. Therefore, since both N devices 52 and 53 each are connected to input lines 57 and 56, respectively, then it can be seen that the output-on lines 58 and 59 is influenced by, or is dependent upon, each of the input signals. In other words, the signal which is output on line 58 depends not only from the input on line 56 (via transistors 50 and 51), but also on the input on line 57 through transistor 52. Similarly, the output on line 59 depends both on the input signal to line 57 (through transistors 54 and 55), and the input to line 56 through transistor 53.

The operation of the circuit of FIG. 5 will now be described. When a logical 1 (A) is input on line 56, then a logical 0 (A complement) is input on line 57. The presence of a voltage on line 56 will turn on N transistor 51 and P transistor 50 will remain off. In this manner, the output 58 is pulled to ground potential through transistor 51. At the same time, the logical 0 at line 57 will not turn on N transistor 52, such that the output of logical 0 (A complement) will remain output on line 58.

The absence of a voltage input on line 57 (A complement) will turn on transistor 54 which places a potential of Vdd on line 59. Also, the input logical 1 on line 56 will turn on N device 53 which also pulls line 59 up to Vdd. Thus, output line 59 is influenced by both of the signals in put on lines 56 and 57.

When a logical 0 (A complement) is input on line 56, then P device 50 is turned on and output line 58 is pulled up to Vdd, while at the same a logical 1 input on line 57 (A) will turn on transistor 52 which also pulls output line 58 to Vdd. Thus, the output on line 58 depends on both of the input signals on lines 56 and 57.

A logical 1 (A) is input on line 57 when the logical 0 (A complement) is input on line 56. This causes N transistor 55 to turn on pulling output line 59 down to ground potential.

It can be seen that the presence of a logical 1 on either of the input lines 56 and 57 will cause two sets of transistors (e.g. 51 and 53, or 52 and 55) to both be turned on. This in turn causes the phase of the signals input on lines 56 and 57 to dynamically adjust itself to 180 degrees. For example, the timing of the output signal on line 58 is based upon the logical 1 input on line 56 (via transistor 51), and the timing of the output signal on line 59 is also based on the logical 1 input on line 56 (via transistor 53). The output of line Similarly, the timing of the output signal on line 59 is based upon the logical 1 input on line 57 (via transistor 55), and the timing of the output signal on line 58 is also based on the logical 1 input on line 57 (via transistor 52).

Thus, the output signals will migrate to a phase equal to 180 degrees since each of the output signals are based on all of the input signals, which alternate in their polarity. For the complementary clock signals to be utilized by systems implementing the present invention an intersection between the waveforms at 50% of the pulse height is equal to 180 degrees phase difference. One advantage of the present invention as shown in FIG. 5 is that not only will a 180 degree phase be maintained when the input signals have a 180 degree phase, but also the output signals will migrate to a 180 degree phase when the phase of the input signals is not at 180 degrees. While it may take more than a single stage to correct an out of phase condition (in a system such as the present invention where the signals are complementary, 180 degrees is considered in phase), it is a simple matter to serially connect circuits, such as shown in FIG. 5 to adjust for an incorrect phase condition.

Figure 3:
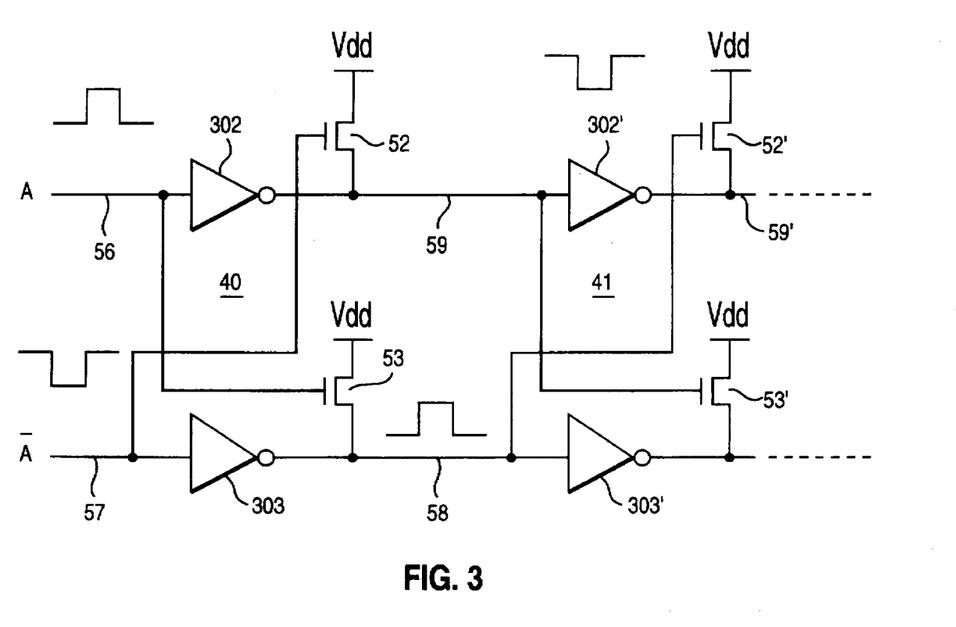
FIG. 3 is a schematic diagram of a first embodiment of a stage of a differential delay device according to the present invention showing two complementary inputs and two complementary outputs tied together with N-type transistors.

FIG. 3 will now be used to describe how the present invention is capable of maintaining an in phase condition and correcting an out of phase condition. FIG. 3 is essentially the same circuit as shown in FIG. 5, however, it can be seen that multiple ones of these circuits can be connected in series in order to provide a different amount of delay depending on the number of stages. Reference numeral 302 is used to represent the inverter circuit of FIG. 5 which includes transistors 50 and 51, and reference numeral 304 is representing transistors 54 and 55.

The operation of the circuit will now be described wherein a logical 1 is input on line 56 to inverter 302 and a logical 0 is input to inverter 303 on line 57. At the same time the logical 1 is input to inverter 302 it is used to turn on N-type transistor 53, causing output node 58 to be pre-charged to Vdd. At the same time inverter 303 is switching the logical 0 on input node 57 to a logical 1, which will be output on node 58. Without pre-charging a substantial amount of time would be required to pull node 58 up to Vdd. However, node 58 has already been pre-charged to Vdd, therefore, a significant amount of time is saved by eliminating the pre-charge time required for inverter 303 to bring node 58 to a logical 1. Even though inverter 302 will invert the logical 1 input on node 56 to a logical 0 on node 59 in a normal fashion (including pre-charge time), the decrease in the time required for inverter 303 to change a logical 0 to a logical 1 will cause the time at which inverters 302 and 303 output their respective signals to converge.

During the next stage, a logical 1 is initially present on node 58 and a logical 0 is present on node 59. Once logical 1 is output on node 58, it will then turn on transistor 52' which will pre-charge node 59' to Vdd such that when inverter 302' outputs the logical 1 (inverter from a logical 0 on node 59) the pre-charging transients will be eliminated and a logical 1 will be present on node 59' faster than it would have been possible, absent pre-charging.

Therefore, it can be seen how the present invention as embodied in FIG. 3 allows one signal (A or A complement) to be corrected with respect to the other. That is, a lagging signal will "catch up" with the leading signal when a logical 0 is being inverted to a logical 1. Conversely, a leading signal can of thought of as being "slowed down" at those stages when a logical 1 is being inverted to a logical 0.

Figure 10:
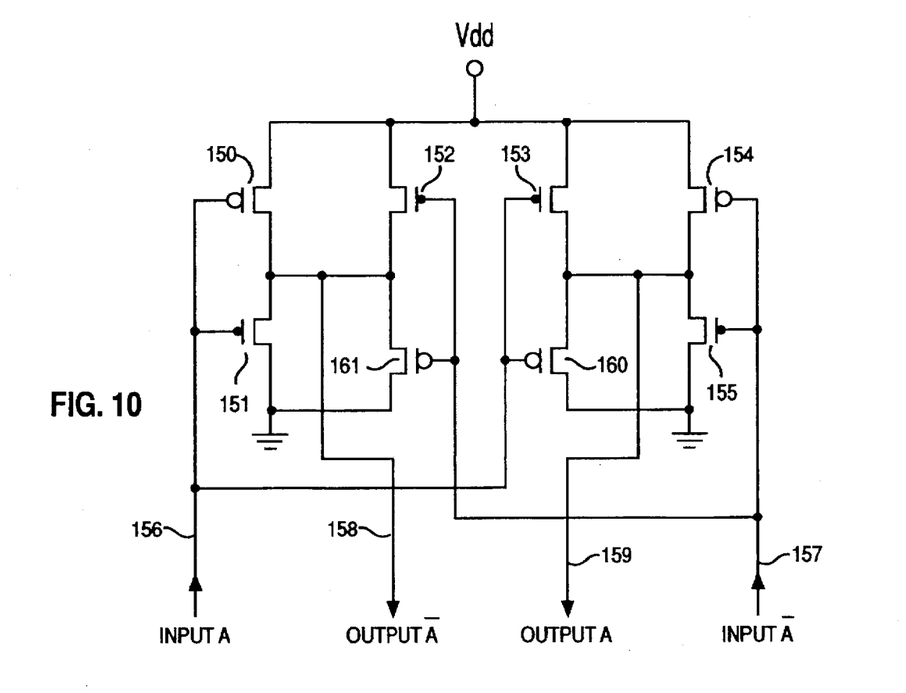
FIG. 10 is a circuit diagram of another embodiment of the present invention wherein two P-type devices are also used to tie the clock signals together.

FIG. 10 is another preferred embodiment of a delay circuit used as a stage in delay devices 24 and 224. An input (A) is provided on line 156 as a clock signal from a phase detector or a previous delay circuit stage to the gates of N transistor 151 and P device 150, which are connected as an inverter. Transistor 151 is also connected to transistor 150 and to ground (reference voltage). The circuit voltage (VDD) is connected to the other side of transistor 150. Input 57 (A complement) provides the differential clock signal (from a phase detector of a previous stage) to N-type transistor 155 and P device 154. These transistors are also connected as an inverter, similarly to devices 150 and 151. That is, transistor 155 is connected to ground and to P device 154, which is also connected to Vdd. Two additional N-type transistors 152 and 153 are connected in parallel with P-type devices 150 and 154. Further, in this embodiment, P-type devices 160 and 161 are connected to ground and N-transistors 153 and 152, respectively. Specifically, the drain of device 152 is connected to Vdd and the source is connected to the drain of device 150 and device 151 and P-transistor 161. The output signal from the inverter circuit (made up of transistors 150 and 151) is provided on line 158 (A complement). Similarly, the drain of transistor 153 is connected to Vdd and its source is connected to P transistor 54, N transistor 55 and P device 160, as shown. The output from the invertor, including transistors 154 and 155, (A) is then transmitted to the next stage, or the like, on line 159.

From FIG. 10 it can also be seen that the input signal on line 156 is connected directly to the gate of both N transistor 153 and P transistor 169. Also, the signal input on line 157 is provided directly to the gate of N transistor 152 and P device 161. It can be seen that N device 152 controls the output on line 158, by pulling it up to Vdd, when turned on. P transistor 161 also controls the output on line 158 by pulling it to ground when turned on. Similarly, N device 153 controls the output of the circuit on line 159 by pulling the voltage of the line up to Vdd, while transistor 160 will pull line 159 down to the reference voltage when turned on. Therefore, since N device 152 and P device 161 are each connected to input line 157, it can be seen that the output on line 158 is dependent on the input signal on line 157. From FIG. 10 it can also be seen that N transistor 153 and P transistor 157 are each connected to input line 156 and that the output on line 159 is dependent upon this input signal. In other words, the signal which is output on line 158 depends not only from the input on line 156 (via transistors 150 and 151), but also on the input on line 157 through transistors 152 and 161. Similarly, the output on line 159 depends both on the input signal to line 157 (through transistors 154 and 155), and the input to line 156 through transistors 153 and 160.

The operation of the circuit of FIG. 10 will now be described. When a logical 1 (A) is input on line 156, then a logical 0 (A complement) is input on line 157. The presence of a voltage on line 156 will turn on N transistor 151 and P transistor 150 will remain off. In this manner, the output 158 is pulled to ground potential through transistor 151. At the same time, the logical 0 at line 157 will turn on P transistor 161, which will help pull the output on line 158 down to ground and effectively pre-charge the line. In this manner the output of logical 0 (A complement) on line 158 from transistor 150 will be a stable logical 0 sooner than it would have been in the absence of transistor 161.

The absence of a voltage (logical 0) input on line 157 (A complement) will turn on transistor 154 which places a potential of Vdd on line 159. Also, the input of logical 1 (A) on line 156 will turn on N device 153 which will pre-charge 159 by pulling it up to Vdd. Thus, the logical 1 output on line 159 will become stable sooner than it would have absent transistor 153. Thus, the output signals on lines 158 and 159 are each dependent on both of the signals input on lines 156 and 157.

If multiple ones of the delay circuits of FIG. 10 are connected in series, the outputs of the previous stage will be connected to the inputs of the next successive stage and the outputs of that stage connected to the inputs of the following stage. In another example, the input on line 156 will be an logical 0 (A complement) since the signal has been inverted from the previous stage. And, the input on line 157 will be a logical 0 for the same reason. In this case the logical 0 on line 156 will be inverted to a logical 1 by turning on transistor 150 and placing Vdd on line 158. Previously the logical 1 on line 157 will have turned on transistor 152 causing it to pre-charge line 158 such that the logical 1 is stable on line 158 before it would have been absent transistor 152. At the same time, the logical 0 on line 156 will cause P device 160 to pre-charge line 159 to the reference voltage. Then, when transistor 155 inverts the logical 1 on line 157 the output line 159 outputs a stable logical 0 sooner than it would have been possible without transistor 160.

Figure 8:
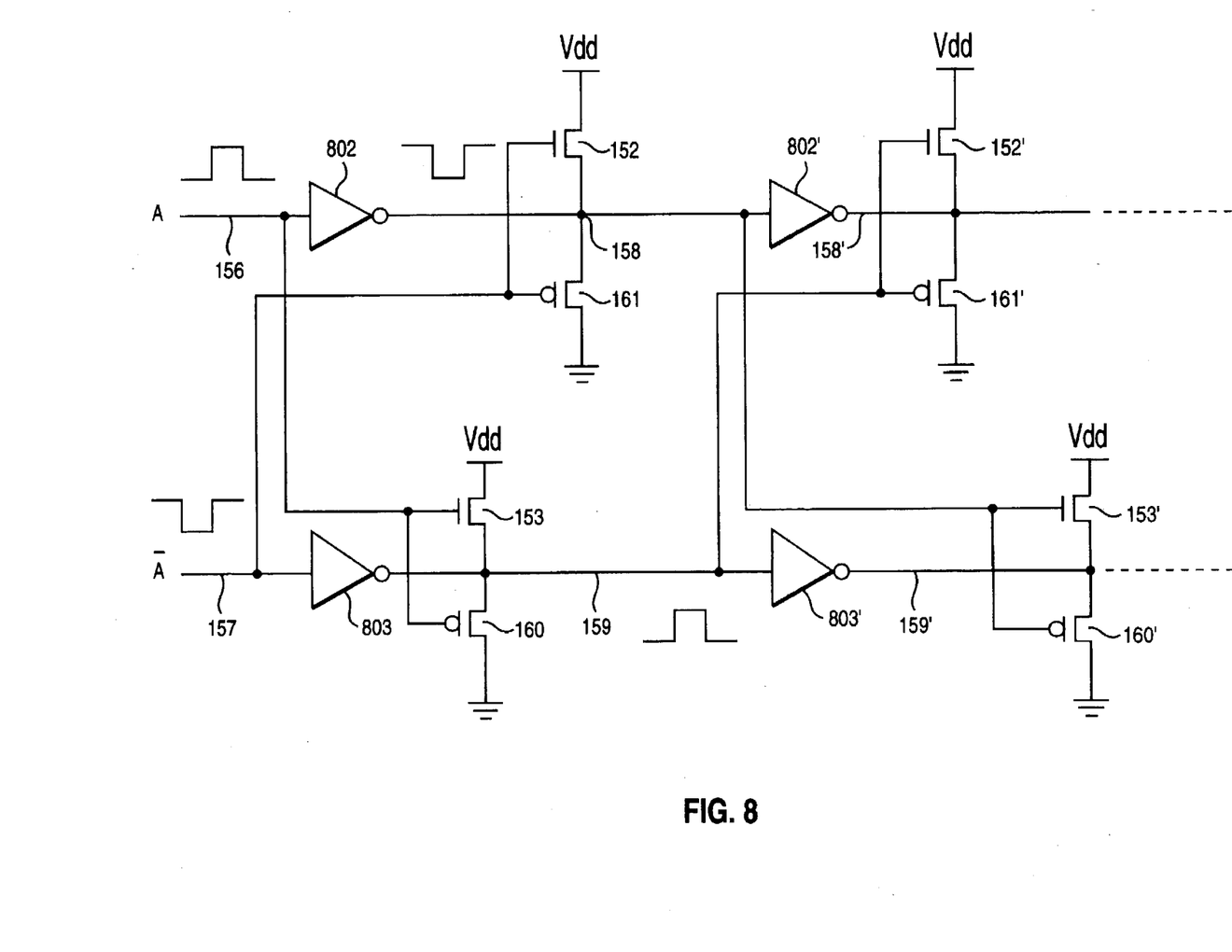
FIG. 8 is a schematic diagram of another embodiment of a stage of a differential delay device according to the present invention.

The operation of the delay device of the present invention will now be further described with reference to FIG. 8, where multiple delay circuit stages are shown. Initially, a logical 1 (A) is input on line 156 to inverter 802 (transistors 150 and 151 of FIG. 10) and a logical 0 (A complement) is input on line 157 to inverter 803 (transistors 154 and 155 of FIG. 10). The logical 0 on line 157 will turn on transistor 161 pre-charging node 159 to ground. Thus, when the logical 0 signal is output by inverter 802 line 158 is already pre-charged, thereby saving the time required for the value to stabilize. Concurrently, the logical 1 input on line 156 will turn on transistor 153 pulling node 159 up to Vdd and pre-charging it. Thus, when inverter 803 outputs a logical 1 as Vdd, line 159 is pre-charged and a stable value for logical 1 is present on line 159 sooner than it would have been absent transistor 153. During the next stage a logical 0 is input to inverter 802' and a logical 1 in put to inverter 803'. At this time, P transistor 160' is turned on due to the logical 0 on line 158. This causes lien 159' to be pre-charged to the reference potential such that the logical 0 output from inverter 803' will stabilize quickly. Additionally, the logical 1 on line 159 will turn on transistor 152' and line 158' will be pre-charged to Vdd, so the logical 1 output from inverter 802' will become stable in a short period of time.

Therefore, it can be seen how this preferred embodiment not only pre-charges the output lines for stages having a logical 1 input (as in the circuit of FIGS. 3 and 5), but also pre-charges the output lines of the complementary signal when a logical 0 is input to the inverter. This causes the complementary clock signals to converge to an in-phase condition more quickly than even the circuit of FIG. 3.

Figure 6:
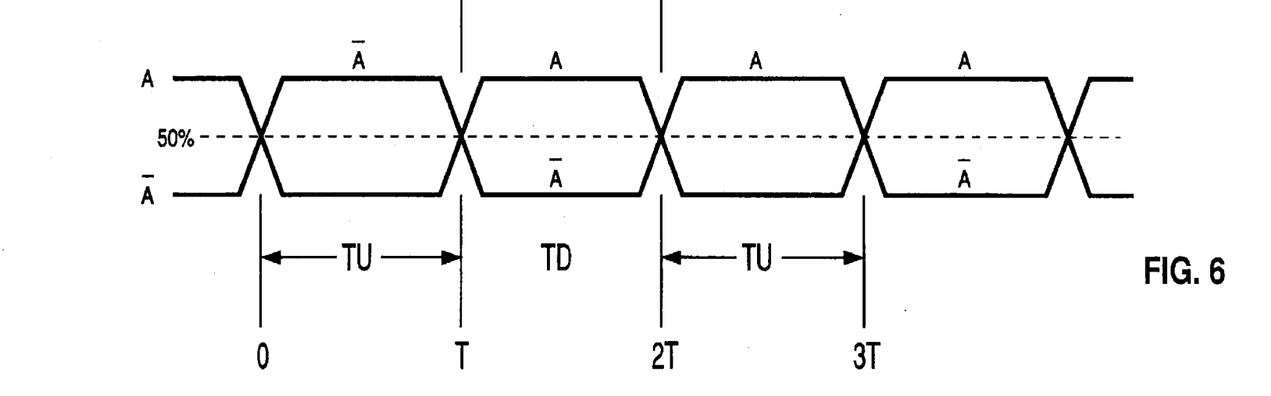
FIG. 6 is a timing diagram illustrating the waveform output from the circuit of FIG. 5 wherein the rising and falling edges of the output signals cross at one-half of the pulse height.

FIG. 6 is a sample waveform of the type of complementary signals contemplated in a preferred embodiment of the present invention. More particularly, clock signals A and A complement are shown. These signals have a 180 degree phase difference. Additionally, it can be seen that the A and A complement signals cross at a point which is 50% of the pulse height. It is important for circuit reliability that the clock signals be received in phase by the device being controlled. In this manner, the devices in the controlled circuit will switch at the proper time. That is, the leading edge of the A signal will switch N-type transistor at the same time the A complement signal switches a P-type transistor. If the circuits are designed to switch at 50% of Vdd, then both turn on at the same time.

Figure 7:
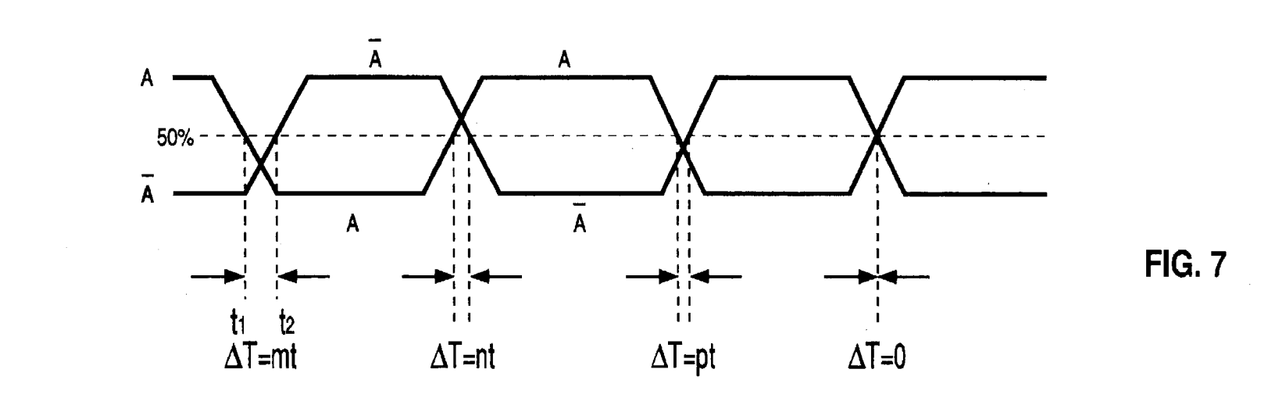
FIG. 7 is a timing diagram showing a waveform of two out of phase signals which can be corrected by the present invention.

FIG. 7 shows two complementary signals having an out of phase condition that is corrected using the present invention. It can be seen that initially the leading edge of A (positive slope) and the leading edge (negative slope) of A complement (or vice versa) do not cross at a point equal to 50% of the pulse height. Thus, the two complementary signals do not have a phase of 180 degrees. This is the type of situation that the present invention will correct. As discussed above, a delay device using the circuits of either FIG. 5 or 10 will cause the signals to converge to an in-phase condition, since the output of an inverter is stabilized more quickly due to the pre-charging of the output line. It should be noted that the circuit of FIG. 10 will cause the signals to converge to an in phase condition more quickly since the output lines for both inverters are pre-charged to appropriate voltage level.

If the signal represented by FIG. 7 is initially input to the delay device of the present invention, using one or more stages utilizing the circuit of FIGS. 5 or 10, then the phase will be adjusted such that the output signals will be in accordance with FIG. 6. Reliability problems exist with the out phase signals represented by FIG. 7, since the leading edges cross do not cross at 50% of pulse height. Assume for example the circuits are designed to switch at 50% of Vdd. At the point $T_1$, a P-type device that receives signal A will switch at a point which corresponds to the pulse height of 50% of Vdd. As shown in FIG. 7, this will occur prior to the point where an N-type device will switch at point $T_2$ that corresponds to 50% of Vdd. This will cause the two devices to switch a different times and create reliability problems that can affect data integrity. Additionally, it can be seen from FIG. 7 that this time difference between points $T_1$ and $T_2$ (delta T equal to a constant multiplied by the units of time: delta T=mt) is decreasing for each stage of the delay device using the circuit of the present invention. After passing through the first stage the time difference (phase) between signals A and A complement is decreased (due to the present invention as previously discussed) to delta T=nt, where n<m. Continuing, through the second stage, delta T=pt, where p<n<m. Finally, after the complementary clock signals pass through a sufficient number of stages, delta T will be equal to zero. At that point, signals A and A complement cross at 50% of pulse height and will switch their respective driver, receiver, or the like, circuits at the optimum time.

Those skilled in the art will understand how the circuits of FIGS. 5 and 10 can be "tuned" by sizing the transistors to provide various threshold voltages thereacross when they are turned on. It should be noted that the present invention is not limited to a specific circuit having specifically sized transistors, but contemplates any circuit which causes output signals to be dependent upon one or more input signals.

While the invention has been shown and described with reference to particular embodiments thereof, it will be understood by those skilled in the art that the foregoing and other changes in form and detail may be made therein without departing from the spirit and scope of the invention.

What is claimed is:

1. A system for outputting at least two signals which are in phase with one another, comprising:

first input means for receiving a first input signal;

second input means for receiving a second input signal;

means for outputting a first output signal, on a first output signal line, and a second output signal, on a second output signal line, which are each delayed in time relative to said first and second input signals, respectively; and means for converging said first and second input signals to an in phase condition by connecting said first and second input signals to said second and first output signal lines, respectively, to pre-charge said first and second output signal lines, based upon said second and first input signals, respectively, before said first and second output signals are output thereon.

2. A system according to claim 1 wherein said means for converging comprises:

first means for pre-charging said first output signal line based upon a state of said second input signal; and second means for pre-charging said second output signal based upon a state of said first input signal.

3. A system according to claim 2 wherein said means for outputting further comprises:

a first inverter circuit connected between said first input means and said first output signal line; and a second inverter circuit connected between said second input means and said second output signal line.

4. A system according to claim 3 wherein said first means for pre-charging comprises a first N-type transistor with its gate connected to the second input means and further connected between a voltage source and said first output signal line.

5. A system according to claim 4 wherein said second means for pre-charging comprises a second N-type transistor with its gate connected to the first input means and further connected between a voltage source and said second output signal line.

6. A system according to claim 3 wherein said first means for pre-charging comprises:

a first N-type transistor with its gate connected to the second input means and further connected to a voltage source and said first output signal line;

a first P-type transistor having its gate connected to the second input means and further connected to ground potential and said first output signal line.

7. A system according to claim 6 wherein said second means for pre-charging comprises:

a second N-type transistor with its gate connected to the first input means and further connected to a voltage source and said second output signal line;

a second P-type transistor having its gate connected to the first input means and further connected to ground potential and said second output signal line.

8. A system according to claim 7 wherein the first output signal and the second output signal are complements of one another.

9. A system according to claim 8 wherein said first output signal and said second output signal intersect one another at a point which is one-half the pulse height of both said first output signal and said second output signal.

10. A method for outputting at least two signals from a control device which are in phase with one another, comprising the steps of:

receiving a first input signal and a second input signal;

outputting a first output signal, on a first output signal line, and a second output signal, on a second output signal line, which are each delayed in time relative to said first and second input signals, respectively; and converging said first and second input signals to an in phase condition by said first and second input signals to said second and first output signal lines, respectively, to pre-charge said first and second output signal lines based upon said second and first input signals, respectively, before said first and second output signals are output thereon.

11. A method according to claim 10 wherein said step of converging comprises the steps of:

pre-charging said first output signal line, by a first pre-charge means, based upon a state of said second input signal; and pre-charging said second output signal, by a second pre-charge means, based upon a state of said first input signal.

12. A method according to claim 11 wherein said step of receiving comprises the steps of:

receiving said first input signal by a first input means; and receiving said second input signal by a second input means.

13. A method according to claim 12, further comprising the steps of:

connecting a first inverter circuit between said first input means and said first pre-charge means; and connecting a second inverter circuit between said second input means and said second pre-charge means.

14. A method according to claim 13 wherein said step of pre-charging said first output signal line comprises the step of connecting the gate of a first N-type transistor to the second input means and further connecting said first N-type transistor between a voltage source and said first output signal line.

15. A method according to claim 14 wherein said step of pre-charging said second output signal line comprises the step of connecting the gate of a second N-type transistor to the first input means and further connecting said second N-type transistor between a voltage source and said second output signal line.

16. A method according to claim 13 wherein said step of pre-charging said first output signal line comprises the steps of:

providing a first N-type transistor with its gate connected to the second input means and further connected to a voltage source and said first output signal line;

providing a first P-type transistor having its gate connected to the second input means and further connected to ground potential and said first output signal line.

17. A method according to claim 16 wherein the step of pre-charging said second output signal line comprises the steps of:

providing a second N-type transistor with its gate connected to the first input means and further connected to a voltage source and said first output signal line;

providing a second P-type transistor having its gate connected to the first input means and further connected to ground potential and said second output signal line.

* * * * *